(12) United States Patent  
Levinson

(10) Patent No.: US 7,006,209 B2
(45) Date of Patent: Feb. 28, 2006

(54) METHOD AND APPARATUS FOR MONITORING AND CONTROLLING IMAGING IN IMMERSION LITHOGRAPHY SYSTEMS

(75) Inventor: Harry J. Levinson, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 333 days.

(21) Appl. No.: 10/628,021

(22) Filed: Jul. 25, 2003

(65) Prior Publication Data

US 2005/0018208 A1 Jan. 27, 2005

(51) Int. Cl.
*G01N 21/41* (2006.01)
(52) U.S. Cl. .................................................. 356/128
(58) Field of Classification Search ................ None
See application file for complete search history.

(56) References Cited

U.S. PATENT DOCUMENTS

| | | | |
|---|---|---|---|
| 4,346,164 A | | 8/1982 | Tabarelli et al. |
| 4,480,910 A | | 11/1984 | Takanashi et al. |
| 4,569,590 A | | 2/1986 | Karny et al. |
| 4,670,637 A | | 6/1987 | Morrison et al. |
| 5,151,752 A | * | 9/1992 | Oono et al. ............ 356/128 |
| 5,422,714 A | | 6/1995 | Fladd |
| 5,610,683 A | | 3/1997 | Takahashi |
| 5,825,043 A | | 10/1998 | Suwa |
| 5,870,189 A | * | 2/1999 | Uesugi et al. ......... 356/335 |
| 6,133,995 A | | 10/2000 | Kubota |
| 6,241,827 B1 | | 6/2001 | Tanaka et al. |
| 6,576,559 B1 | | 6/2003 | Nakata et al. |
| 2002/0163629 A1 | | 11/2002 | Switkes et al. |

FOREIGN PATENT DOCUMENTS

| | | |
|---|---|---|
| EP | 0 605 103 | 7/1994 |
| EP | 0 657 713 | 6/1995 |
| EP | 1 486 827 | 12/2004 |
| EP | 1 489 461 | 12/2004 |
| WO | WO 99/01797 | 1/1999 |
| WO | WO 01/88506 | 11/2001 |
| WO | WO 02/091078 | 11/2002 |
| WO | WO 2005/006026 | 1/2005 |

OTHER PUBLICATIONS

International Search Report and Written Opinion for PCT/US2004/023876 dated Jul. 6, 2005.
International Search Report and Written Opinion for PCT/US2004/023875 dated Jul. 6, 2005.
International Search Report and Written Opinion for PCT/US2004/028371 dated Jul. 6, 2005.

* cited by examiner

*Primary Examiner*—Gregory J. Toatley, Jr.
*Assistant Examiner*—Amanda Merlino
(74) *Attorney, Agent, or Firm*—Renner, Otto, Boisselle & Sklar, LLP

(57) ABSTRACT

A method of monitoring an immersion lithography system in which a wafer can be immersed in a liquid immersion medium. The method detects an index of refraction of the immersion medium in a volume of the immersion medium through which an exposure pattern is configured to traverse and determines if the index of refraction is acceptable for exposing the wafer with the exposure pattern. Also disclosed is a monitoring and control system for an immersion lithography system.

17 Claims, 1 Drawing Sheet

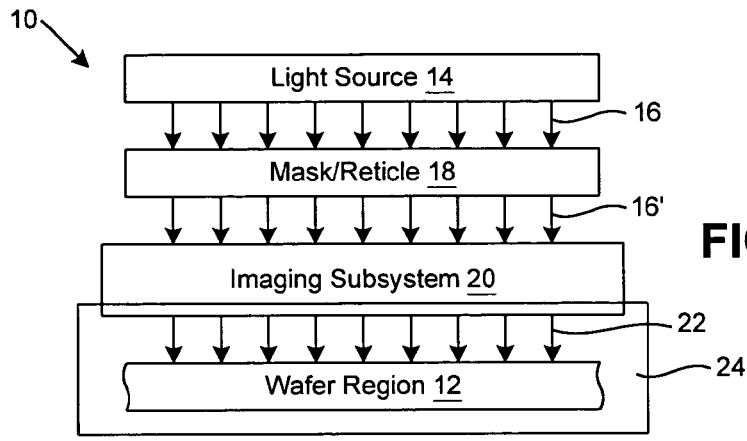
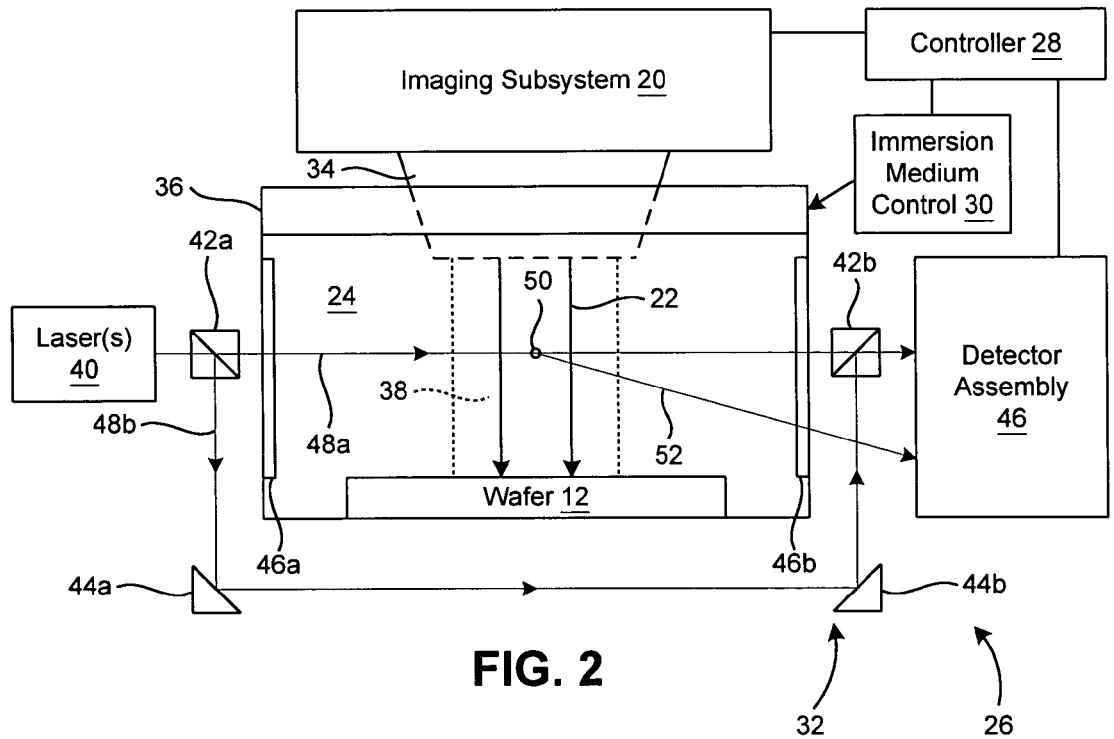

METHOD AND APPARATUS FOR MONITORING AND CONTROLLING IMAGING IN IMMERSION LITHOGRAPHY SYSTEMS

TECHNICAL FIELD

The present invention relates generally to the field of integrated circuit manufacture and, more particularly, to a method and apparatus for monitoring and/or controlling imaging of a wafer by immersion lithography.

BACKGROUND

The formation of various integrated circuit (IC) structures on a wafer often relies on lithographic processes, sometimes referred to as photolithography. For instance, patterns can be formed from a photo resist (PR) layer by passing light energy through a mask (or reticle) having an arrangement to image the desired pattern onto the PR layer. As a result, the pattern is transferred to the PR layer. In areas where the PR is sufficiently exposed and after a development cycle, the PR material can become soluble such that it can be removed to selectively expose an underlying layer (e.g., a semiconductor layer, a metal or metal containing layer, a dielectric layer, etc.). Portions of the PR layer not exposed to a threshold amount of light energy will not be removed and serve to protect the underlying layer. The exposed portions of the underlying layer can then be etched (e.g., by using a chemical wet etch or a dry reactive ion etch (RIE)) such that the pattern formed from the PR layer is transferred to the underlying layer. Alternatively, the PR layer can be used to block dopant implantation into the protected portions of the underlying layer or to retard reaction of the protected portions of the underlying layer. Thereafter, the remaining portions of the PR layer can be stripped.

There is a pervasive trend in the art of IC fabrication to increase the density with which various structures are arranged. As a result, there is a corresponding need to increase the resolution capability of lithography systems. One promising alternative to conventional optical lithography is a next-generation lithographic technique known as immersion lithography. In immersion lithography, the wafer to imaged by a lithography system is placed in a liquid medium, through which the patterned light is transmitted. The immersion medium replaces an air gap that is conventionally present between the final lens of a conventional dry lithography imaging system and the wafer.

However, attempts to implement immersion lithography have encountered a number of challenges. For example, minor variations in the index of refraction of the immersion medium can adversely effect the quality of the exposure pattern incident on the wafer.

Accordingly, there exists a need in the art for improved immersion lithography systems and associated methods of controlling imaging using immersion lithography systems.

SUMMARY OF THE INVENTION

According to one aspect of the invention, the invention is directed to a method of monitoring an immersion lithography system. The method can include immersing a wafer to be exposed in a liquid immersion medium; detecting an index of refraction of the immersion medium in a volume of the immersion medium through which an exposure pattern is configured to traverse; and determining if the index of refraction is acceptable for exposing the wafer with the exposure pattern.

According to another aspect of the invention, the invention is directed to a monitoring and control system for an immersion lithography system. The immersion lithography system can include a chamber for receiving a wafer to be exposed and immersing the wafer in an immersion medium and an imaging subsystem for directing an exposure pattern towards the wafer and through the immersion medium. The monitoring and control system can include an immersion medium monitoring subsystem including an interferometer assembly for directing a test portion of a laser beam through the immersion medium and for directing a control portion of the laser beam around the chamber, and a detector assembly for receiving the test portion and the control portion, the detector outputting a signal indicative of an index of refraction of the immersion medium in a volume of the immersion medium through which the exposure pattern is configured to traverse; and a controller, the controller receiving the signal indicative of the index of refraction and determining if the index of refraction is acceptable for exposing the wafer with the exposure pattern.

BRIEF DESCRIPTION OF DRAWINGS

These and further features of the present invention will be apparent with reference to the following description and drawings, wherein:

FIG. 1 is a schematic block diagram of a exemplary integrated circuit processing arrangement; and FIG. 2 is a schematic block diagram of an immersion medium monitoring and control assembly for the exemplary integrated circuit processing arrangement.

DISCLOSURE OF INVENTION

In the detailed description that follows, some corresponding components have been given the same reference numerals, regardless of whether they are shown in different embodiments of the present invention. To illustrate the present invention in a clear and concise manner, the drawings may not necessarily be to scale and certain features may be shown in somewhat schematic form.

The description herein is presented in the exemplary context of fabricating a wafer having an integrated circuit (IC) formed thereon. Example ICs include general purpose microprocessors made from thousands or millions of transistors, a flash memory array or any other dedicated circuitry. However, one skilled in the art will appreciate that the methods and devices described herein can also be applied to the fabrication of any article manufactured using lithography, such as micromachines, disk drive heads, gene chips, micro electro-mechanical systems (MEMS) and so forth.

The apparatus and methods described herein can provide for real-time detection of a key parameter for immersion lithography. Namely, index of refraction of a liquid immersion medium can be monitored to determine if conditions are favorable for exposing a wafer. In addition, the immersion medium can be monitored for the presence of a foreign body (e.g., a particle and/or a bubble).

Referring to FIG. 1, illustrated is a schematic block diagram of an exemplary IC processing arrangement that includes an immersion lithography system 10 used to image a pattern onto a wafer 12, or a region thereof. The system 10 can be, for example, a step-and-repeat exposure system or a step-and-scan exposure system, but is not limited to these example systems. The system 10 can include a light source 14 for directing light energy 16 towards a mask 18 (sometimes referred to as a reticle). The light energy 16 can have, for example, a deep ultraviolet wavelength (e.g., about 248 nm or about 193 nm), or a vacuum ultraviolet (VUV) wavelength (e.g., about 157 nm).

The mask 18 selectively blocks light energy 16 such that a light energy pattern 16' defined by the mask 18 is transferred towards the wafer 12. An imaging subsystem 20, such as a stepper assembly or a scanner assembly, sequentially directs the energy pattern 16' transmitted by the mask 18 to a series of desired locations on the wafer 12. The imaging subsystem 20 may include a series of lenses and/or reflectors for use in scaling and directing the energy pattern 16' towards the wafer 12 in the form of an imaging (or exposure) light energy pattern 22.

The imaging pattern 22 (or exposure pattern) is transmitted by the imaging subsystem 20 through an immersion fluid, or immersion medium 24, that has a relatively high index of refraction (e.g., an index of refraction greater than 1). The immersion medium 24 can be a liquid. In one example, purified de-ionized water can be used in conjunction with a 193. nm light source 14 (e.g., an argon fluorine (ArF) laser). In another example, polyfluoroethers can be used in conjunction with a 157. nm light source 14.

Changes and variations to the index of refraction (also referred to as refractive index) of the immersion medium 24 can have a significant effect of the imaging pattern 22 incident on the wafer 12. For example, if the index of refraction of the immersion medium 24 uniformly changes across the volume through which the imaging pattern 24 traverses, a focus shift may result and/or spherical aberrations could result. If the index of refraction of the immersion medium 24 varies non-uniformly across the volume through which the imaging pattern 22 traverses, unpredictable aberrations in the imaging pattern 22 incident on the wafer 12 are very likely to occur. As should be apparent, changes and/or variations in the index of refraction of the immersion medium 24 can lead to defects in the integrated circuit being fabricated on the wafer 12.

Without intending to be bound by theory, the cause(s) of changes and/or variations in the index of refraction of the immersion medium 24 can include, for example, turbulence of the immersion medium 24, changes in density of the immersion medium 24, changes in temperature of the immersion medium 24 and so forth. In dry lithography (i.e., the imaging pattern traverses an air or gas gap), several joules of energy can be absorbed by the wafer from the exposure dose. In immersion lithography, it is believed that at least some of the energy from the imaging pattern 22 will be absorbed by the immersion medium 24. Also, since the immersion medium 24 is in contact with at least the wafer 12, heat may be transferred from the wafer 12 to immersion medium 24. The absorption of energy by the immersion medium 24, even in small quantities, may be sufficient to create a variation in the index of refraction of the immersion medium 24 that could adversely effect the imaging pattern 22. Also, the wafer 12 may be mounted on a stage (not shown) that is moved relative to the imaging subsystem 20. For example, the wafer 12 may be exposed, then moved about 30. mm to a new location and stopped for a second exposure and so forth. Wafer motion rates can be about 250. mm/second to about 500. mm/second. This movement may create turbulence or other changes to the properties of the immersion medium 24 that could result in variations in the index of refraction of the immersion medium 24. In addition, it is contemplated that the immersion medium 24 may be purposefully placed in motion (e.g., in a flow pattern over the wafer 12) or subjected to hydraulic pressure. These factors may also invoke variations in the index of refraction of the immersion medium 24.

Therefore, it is desirable to monitor and control the index of refraction of the immersion medium 24. With additional reference to FIG. 2, shown is a schematic block diagram of an immersion medium 24 monitoring and control assembly 26 for use with the exemplary IC processing arrangement 10. The assembly 26 includes a controller 28, such as a computer programmed to control the IC processing arrangement 10 and an immersion medium control subsystem 30. The controller 28 can receive an input signal or signals from an immersion medium monitoring subsystem 32.

As indicated, the imaging subsystem 20 can include an output lens 34, or other final optical structure. At least a portion of the imaging subsystem 20, including the lens 34, can enter a chamber 36 containing the immersion medium 24 and the wafer 12. The lens 34 will be in intimate contact with the immersion medium 24 such that the imaging pattern 22 output by the lens 34 is projected through the immersion medium 24 and is incident onto at least a portion of the wafer 12, which is disposed or immersed in the immersion medium 24.

The volume of immersion medium 24 in the field of view of the imaging pattern 22 (e.g., the volume or portion of the immersion medium 24 through which the imaging pattern 22 traverses) will be referred to herein as traversed volume 38. In one embodiment, the lens 34 can be disposed about 1. mm above the wafer 12. However, the distance between the lens 34 and wafer 12 may vary depending on the illumination wavelength, the immersion medium 24, the specific processing arrangement 10, the devices being fabricated on the wafer 12, the particular photo resist employed, an so forth. In some arrangements, the traversal volume can be about 25. mm wide and 10. mm long, although these parameters can vary widely.

The monitoring subsystem 32 includes devices to monitor the index of refraction of the immersion medium 24 or a portion thereof, such as the index of refraction throughout the traversal volume 38 portion of the immersion medium 24. The monitoring subsystem 32 can include at least one interferometer assembly, such as a Michelson interferometer. Therefore, the monitoring subsystem 32 can include, for example, a laser beam source 40, a pair of beam splitters 42a. and 42b, a pair of mirrors 44a. and 44b. and a detector assembly 46. The detector assembly 46 can be implemented with, for example, a photomultiplier tube. In one embodiment, the beam generated by the laser 40 is several hundred microns in diameter. Therefore, multiple beams produced by one or more lasers 40 can be used to simultaneously monitor the index of refraction of the immersion medium 24 along several lines in the traversal volume 38. If needed, multiple beam splitters 42, mirrors 44 and detectors can be added. For simplicity, the monitoring associated with only one beam is shown and described. However, implementing a multiple beam interferometer system should be apparent to one of ordinary skill in the art. In an alternative embodiment, one or more beams can be scanned through the traversal volume 38 to generate an indication of the index of refraction of the immersion medium 24 throughout the traversal volume 38.

The laser 40 should be selected to generate an output wavelength to avoid activation of the photo resist disposed on the wafer 12. For example, the wavelength should be about 300 nm or above (e.g., in the visible spectrum), but this parameter can vary depending on the properties of the photo resist used. In one embodiment, a helium neon (HeNe) laser can be used. This laser beam can optionally be subjected to Zeeman splitting by an axial magnetic field.

The chamber 36 can include an entrance window 46a through which a test portion 48a of the beam generated by the laser 40 enters the chamber 36 and an exit window 46b through which the test portion 48a exits the chamber 36. The windows 46 should be transmissive of the wavelength of the beam generated by the laser 40 and can include an anti-reflective coating or other mechanism for facilitating test portion 48a transmission.

As is common for the use of interferometers, the beam output by the laser 40 is split into the test portion 48a and a control portion 48b by the beam splitter 42a. The control portion 48b can travel through an air medium around the chamber 36 as guided by the mirrors 44a and 44b The test portion 48a and the control portion 48b are brought together by the beam splitter 42b such that the test portion 48a and the control portion 48b are directed to the detector assembly 46. The detector assembly 46 can be configured to determine the phase difference between the test portion 48a and the control portion 48b.The phase difference can be used as a direct indicator of the index of refraction of the immersion medium 24 at the wavelength of the beam generated by the laser 40.

Alternatively, the test portion 48a may be a first wavelength generated by Zeeman splitting and a second wavelength generated by the Zeeman splitting can be used for the control portion 48b In this case, conventional heterodyne detection can be used to determine a frequency difference between the test and control portions. The frequency difference is then indicative of refractive index of the immersion medium 24.

As indicated, multiple beams can be used to determine the index of refraction of the immersion medium 24 at multiple locations of the traversal volume 38, if not all of the traversal volume 38. Alternative, one or more beams can be scanned across the traversal volume 38 to determine the index of refraction at multiple locations of the traversal volume 38, if not all of the traversal volume 38.

The measurement or measurements of index of refraction, or raw data from the monitoring subsystem 32 from which the measurement(s) of index of refraction can be calculated, can be transmitted from the detector assembly 46 to the controller 28 in the form of an input signal or signals. The controller 28 can process the input signal(s) to determine if the index of refraction of the immersion medium 24 is uniform across the traversal volume and/or the controller 28 can process the input signal(s) to determine if the index of refraction of the immersion medium 24 is within an acceptable range for imaging the wafer 12 with the system 10.

In one embodiment, determination of index of refraction acceptability can include calculating changes or variations in the immersion medium's 24 refractive index at the exposure wavelength (e.g., ultraviolet, DUV or VUV) by correlation to the results derived from the monitoring subsystem 32, which operates a different wavelength (e.g., in the visible spectrum). Refractive index changes of a chemically pure, or nearly pure, medium (such as the immersion medium 24) are based in large part to changes in density of the medium. By measuring the refractive index at one wavelength (e.g., the wavelength emitted by the laser 40), density is indirectly measured and this measurement can be used to infer or derive the refractive index at a different wavelength (e.g., the wavelength of the exposure light source 14).

If the index of refraction is uniform and within an acceptable range for the exposure wavelength, the controller 28 can issue commands to the system 10 to expose the wafer 12. However, if the index of refraction is not uniform across the traversal volume 38 or if the index of refraction is not within an acceptable range for exposing the wafer 12 at the exposure wavelength, then it can be concluded that conditions are not favorable for exposing the wafer 12 and the controller 28 be programmed to defer exposing the wafer.

If either of these unfavorable conditions exist, the controller 28 can be programmed to carry out one or more specified actions. For example, the controller 28 can be programmed to simply wait for a predetermined period of time during which it is expected that the immersion medium 24 may settle to a more favorable state. After the predetermined period, the index of refraction of the immersion medium 24 can be retested. In another example, the controller 28 be programmed to take a corrective action. Example correction actions can include sending commands to the immersion medium control subsystem 30, such as commands to cool or warm the immersion medium 24, to decrease or increase an immersion medium 24 flow rate, and so forth. In another example, the controller 28 can be programmed to alert an operator to the unfavorable environment for imaging the wafer 12. Alerting an operator may be reserved for situations where repeated measurements of the immersion medium 24 have revealed unfavorable conditions and/or when the index of refraction of the immersion medium 24 is above a predetermined high threshold or below a predetermined low threshold. In yet another example, the controller 28 can be programmed to perform more than one of the foregoing functions, such as waiting a predetermined period of time and taking a corrective action.

In addition to monitoring refractive index of the immersion medium 24, the monitoring subsystem 32 can be used to detect a foreign body 50 in the immersion medium 24. In one embodiment, the monitoring subsystem 32 is configured to detect the presence of the foreign body 50 in the traversal volume 38. The foreign body 50 can include a particle (e.g., an item suspended in the immersion medium 24, such as dust, a contaminant, a stray piece of photo resist, etc.) or a bubble (e.g., an air or other gas pocket in the immersion medium 24). The presence of a foreign body 50 in the immersion medium, even if very small (e.g., about 50 nm or smaller), can be detrimental to the quality of the pattern imaged on the wafer 12 by the system 10.

If the test portion 48a of the beam is incident upon the foreign body 50, some of the test portion 48a may become scattered as scattered light 52. The scattered light 52 can be detected by the detector apparatus 46 or by a separate detector assembly. Alternatively, laser beams and detectors separate from those used to monitor immersion medium 24 refractive index can be used for monitoring for foreign bodies.

Upon detection of scattered light, the detector assembly 46 can transmit a corresponding signal to the controller 48 that, in turn, can defer imaging of the wafer 12. In addition, the controller 28 can be programmed to carry out one or more specified actions. For example, the controller 28 can be programmed to simply wait for a predetermined period of time during which it is expected that the foreign body will move out of the traversal volume 38. After the predetermined period, the index of refraction of the immersion medium 24 can be retested. In another example, the controller 28 be programmed to take a corrective action. Example correction actions can include sending commands to the immersion medium control subsystem 30, such as commands to decrease or increase an immersion medium 24 flow rate. In another example, the controller 28 can be programmed to alert an operator to the unfavorable environment for imaging the wafer 12. Alerting an operator may be reserved for situations where repeated measurements of the immersion medium 24 have revealed the presence of a foreign body 50. In yet another example, the controller 28 can be programmed to perform more than one of the foregoing functions, such as waiting a predetermined period of time and taking a corrective action.

The controller 28 can also be programmed to factor the refractive index value(s) with other information provided by additional sensors (not shown). Such other information can include thermal sensors that monitor the temperature of the immersion medium 24 and/or imaging subsystem 20 components, sensors that detect the position of the wafer 12, flow rate sensors that monitor the flow or turbulence of the immersion medium 24, and so forth. Based upon a plurality of factors, the controller 28 can be programmed to take one or more of the actions discussed above, or other actions not specifically identified herein.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of monitoring an immersion lithography system, comprising:
    immersing at least a portion of a wafer to be exposed in a liquid immersion medium;
    detecting an index of refraction of the immersion medium in a volumetric portion of the immersion medium through which an exposure pattern is configured to traverse; and
    determining if the index of refraction is acceptable for exposing the wafer with the exposure pattern by determining i) if the index of refraction is uniform across the traversal volume, ii) if the index of refraction in the traversal volume is within an acceptable range, or iii) both i) and ii).

2. The method according to claim 1, wherein the determining includes determining if the index of refraction is uniform from a first location in the traversal volume to a second location in the traversal volume.

3. The method according to claim 1, wherein the determining includes correlating a measured index of refraction at a measurement device wavelength to an exposure index of refraction at a wavelength of the exposure pattern.

4. The method according to claim 1, wherein the index of refraction is measured throughout the traversal volume.

5. The method according to claim 4, wherein the index of refraction is measured with an interferometer assembly.

6. The method according to claim 5, wherein multiple beams are used to measure the index of refraction throughout the traversal volume.

7. The method according to claim 5, wherein at least one beam is scanned through the traversal volume to measure the index of refraction throughout the traversal volume.

8. The method according to claim 4, wherein the determining includes determining if the index of refraction is uniform from a first location in the traversal volume to a second location in the traversal volume.

9. The method according to claim 1, further comprising controlling the immersion lithography system to defer exposing the wafer if the index of refraction is determined to be unacceptable.

10. The method according to claim 9, wherein the immersion lithography system is controlled to wait a predetermined period of time and repeat the detecting and determining if the index of refraction is determined to be unacceptable.

11. The method according to claim 9, wherein the immersion lithography system is controlled to send commands to an immersion medium control subsystem if the index of refraction is determined to be unacceptable.

12. The method according to claim 1, further comprising monitoring the immersion medium for presence of a foreign body in at least the traversal volume.

13. The method according to claim 12, wherein the foreign body is at least one of a particle or a bubble.

14. The method according to claim 12, wherein the monitoring for the foreign body is carded out by detecting scattered light from a laser beam used to detect the index of refraction.

15. The method according to claim 12, further comprising controlling the immersion lithography system to defer exposing the wafer is presence of the foreign body is detected.

16. A monitoring and control system for an immersion lithography system, the immersion lithography system including a chamber for receiving a wafer to be exposed and immersing at least a portion of the wafer in an immersion medium and an imaging subsystem for directing an exposure pattern towards the wafer and through the immersion medium, comprising:
    an immersion medium monitoring subsystem including an interferometer assembly for directing a test portion of a laser beam through the immersion medium and for directing a control portion of the laser beam around the chamber, and a detector assembly for receiving the test portion and the control portion, the detector outputting a signal indicative of an index of refraction of the immersion medium in a volumetric portion of the immersion medium through which the exposure pattern is configured to traverse; and
    a continuer, the controller receiving the signal indicative of the index of refraction and determining if the index of refraction is acceptable for exposing the wafer with the exposure pattern by determining i) if the index of refraction is uniform across the traversal volume, ii) if the index of refraction in the traversal volume is within an acceptable range, or iii) both i) and ii).

17. The monitoring and control system according to claim 16, wherein the determining includes determining if the index of refraction is uniform from a first location in the traversal volume to a second location in the traversal volume.

* * * * *

UNITED STATES PATENT AND TRADEMARK OFFICE
CERTIFICATE OF CORRECTION

PATENT NO. : 7,006,209 B2
DATED : February 28, 2006
INVENTOR(S) : Harry J. Levinson It is certified that error appears in the above-identified patent and that said Letters Patent is hereby corrected as shown below:

Column 3,
Line 20, replace "a 193. nm" with -- a 193 nm --.
Line 22, replace "a 157. nm" with -- a 157 nm --.
Line 59, replace "about 30. mm" with -- about 30 mm --.
Lines 60-61, replace "about 250. mm/second to about 500. mm/second" with
-- about 250 mm/second to about 500 mm/second --.

Column 4,
Line 27, replace "about 1. mm" with -- about 1 mm --.
Lines 33-34, replace "about 25. mm wide and 10. mm" with -- about 25 mm wide and
10 mm --.
Line 44, replace "42a. and 42b, a pair of mirrors 44a. and 44b. and" with -- 42a and 42b,
a pair of mirrors 44a and 44b and --.

Column 5,
Line 13, replace "and 44b The" with -- and 44b. The --.
Line 26, replace "portion 48b In" with -- portion 48b. In --.

Column 8,
Line 20, replace "is carded out" with -- is carried out --.
Line 45, replace "a continuer, the" with -- a controller, the --.

Signed and Sealed this

Thirtieth Day of May, 2006

JON W. DUDAS
*Director of the United States Patent and Trademark Office*